United States Patent [19]

Homma et al.

[11] 4,394,245

[45] Jul. 19, 1983

[54] SPUTTERING APPARATUS

[75] Inventors: Yoshio Homma; Sukeyoshi Tsunekawa, both of Hachioji; Hiroshi Morisaki, Yokohama; Seiki Harada, Hachioji, all of Japan

[73] Assignee: Hitachi, Ltd., Tokyo, Japan

[21] Appl. No.: 346,959

[22] Filed: Feb. 8, 1982

[30] Foreign Application Priority Data

Feb. 18, 1981 [JP] Japan ................................ 56-21550

[51] Int. Cl.$^3$ ............................................. C23C 15/00
[52] U.S. Cl. ............................. 204/298; 204/192 C; 204/192 R
[58] Field of Search ........................................ 204/298

[56] References Cited

U.S. PATENT DOCUMENTS

| | | | |
|---|---|---|---|
| 3,878,085 | 4/1975 | Corbani | 204/298 |
| 4,094,764 | 6/1978 | Boucher et al. | 204/298 |
| 4,169,031 | 9/1979 | Brors | 204/298 |

OTHER PUBLICATIONS

Meckel et al., Research Disclosure, Oct. 1979, pp. 537–540.

*Primary Examiner*—Arthur P. Demers
*Attorney, Agent, or Firm*—Antonelli, Terry & Wands

[57] ABSTRACT

Herein disclosed is a sputtering apparatus in which a substrate electrode has its electrode surface plate made of a soft magnetic material. The thickness distribution of the film deposited is made uniform by the use of the sputtering apparatus.

11 Claims, 4 Drawing Figures

RELATIVE POSITION ON THE
SUBSTRATE ELECTRODE SURFACE

SPUTTERING APPARATUS

BACKGROUND OF THE INVENTION

The present invention relates to a sputtering apparatus for forming a thin film of a predetermined material on a predetermined substrate by the use of ions which are emitted by a discharge under a reduced pressure.

A sputtering apparatus according to the prior art is constructed such that a cathode and a substrate electrode are mounted in an evacuated chamber acting as a ground shield, and there is mounted on that cathode a target which is made of such a material as is to be deposited on the substrate. The substrate to be formed with a thin film made of the target material is placed on that electrode surface plate of the substrate electrode, which is positioned to face the cathode. The substrate electrode is either grounded to the earth or connected through a power divider with a high-frequency power source. The latter is called the "bias sputtering method", which is suitable for forming a flat thin film on a substrate having rough surfaces. This bias sputtering method is disclosed in detail in Japanese Patent Laid-Open Publication No. 50-24079 and Japanese Patent Publication No. 51-22912, for example. However, since the sputtering operation by such sputtering apparatus has a low deposition rate, a sputtering apparatus including a permanent magnet in the cathode has been used so as to enhance the deposition rate. The cathode thus having the permanent magnet therein is called the "planar magnetron high rate cathode", which is disclosed in detail in Japanese Patent Publication No. 53-19319, for example. Both the cathode and the substrate electrode of the sputtering apparatus thus far described according to the prior art have been made of a non-magnetic material such as Al, Cu, stainless steel or an alloy containing Al, Cu or the like.

FIG. 1a is a schematic section showing one example of a sputtering apparatus. In an evacuated chamber 11, there are mounted a cathode 12 and a substrate electrode 13. Inside of the cathode 12, there is disposed a permanent magnet 20. A substrate 15 to be formed with a desired thin film is made of Si, for example, and is placed on the electrode surface plate 14 (which is made of a non-magnetic material according to the prior art) of the substrate electrode 13. A target 16 is made of such a material as is to form the thin film on the substrate 15, such as Al or $SiO_2$. The cathode 12 and the substrate electrode 13 are cooled with water, and the cathode 12 itself is connected with a high-frequency power source 17. On the other hand, the substrate electrode 13 is also connected through a power divider 10 with the high-frequency power source 17.

One example of the deposition rate distribution of the thin film material on the electrode surface plate 14 in case the sputtering operation is carried out by the use of the sputtering apparatus thus far described is plotted as a curve 18 in FIG. 1b. According to this example, the ratio of the radius $r_1$ of a region (which will be shortly referred to as a "uniform region"), in which the distribution of the thickness of the film formed on the substrate 15 is within ±10%, to the radius R of the electrode surface plate is 0.18 at the most so that the region, in which the thickness of the thin film formed is substantially uniform, is remarkably limited. In other words, the usable size of the substrate 15 is undesirably limited to a remarkable extent according to the prior art apparatus. Incidentally, more detailed description referring to FIGS. 1a and 1b will be made in connection with the embodiments of the present invention.

The following references are cited to show the state of the art: (i) Japanese Patent Publication No. 51-22912; (ii) Japanese Patent Publication No. 53-19319; and (iii) Japanese Patent Laid-Open Publication No. 50-24079.

SUMMARY OF THE INVENTION

It is an object of the present invention to provide a sputtering apparatus which is freed from the disadvantages thus far described according to the prior art and which is remarkably improved in the uniformity in the thickness distribution of a film deposited.

In order to achieve the above-specified object, according to the present invention, there is provided a sputtering apparatus which comprises at least one cathode and at least one substrate electrode and which is characterized in that that electrode surface plate of said at least one substrate electrode which faces said cathode, has at least a portion thereof that is made of a soft magnetic material having an initial permeability of at least 100.

The supporting apparatus having the construction thus far described according to the present invention is featured especially by its cathode of the planar magnetron high rate type and can enjoy marked effects in case it is used in the bias sputtering method.

In case the above-specified soft magnetic material has an initial permeability lower than 100, the improvement in the uniformity of the deposition rate distribution is undesirably insufficient. As the above soft magnetic material, there can be enumerated, by way of example, pure steel (which contains 0.5 wt. % of an impurity at the highest), iron-silicon alloys, alperm, sendust, permalloy, super-permalloy, mumetal, 42-45 perminver or ferroxcube.

The representative compositions of the respective soft magnetic materials enumerated in the above are: 1% Si-Fe for the iron-silicon alloys; 16% Al-Fe for the alperm; 9.5% Si-5.5% Al-Fe for the sendust; 45% Ni-Fe or 80% Ni-Fe for the permalloy; 79% Ni-5% Mo-0.3% Mn-Fe for the super-permalloy; 77% Ni-2% Cr-5% Cu-Fe for the mumetal; and 45% Ni-25% Co-Fe for the perminver. Here, the respective percentages % are in weight, and the remainder is Fe. On the other hand, the ferroxcube is a general name of cubic system ferrites.

It is desired that the thickness of the above-enumerated soft magnetic materials constructing at least a portion of the aforementioned electrode surface plate be equal to or larger than 1 μm. If that thickness exceeds 1 μm, the resultant effects are little varied even with the variation in the thickness. Although there is not especially an upper limit to the thickness of the soft magnetic material, there is a limit to the spacing between the cathode and the substrate electrode to be used in the sputtering apparatus. For practical purposes, therefore, that upper limit is made by that spacing. In case the thickness is less than 1 μm, it may become difficult to form a continuous film even by the use of the vacuum evaporation method or the like. In this case, the resultant effects of the present invention become deficient.

Although it is the most desirable that the aforementioned electrode surface plate be made wholly of one of the above-enumerated soft magnetic materials, acceptable effects can be obtained even if the anode electrode surface has its remarkably limited portion made of the soft magnetic material. It is sufficient as a measure that the portion of the anode electrode surface of a non-magnetic material, in which the film formation rate is equal to or lower than one half of the maximum, be replaced by the soft magnetic material. In order to attain substantially satisfactory effects, however, it is necessary that at least 20% of the aforementioned electrode surface plate be made of the soft magnetic material.

Moreover, that electrode surface plate may be prepared such that the surface of a non-magnetic material is covered with one of the soft magnetic materials or a non-magnetic material. As this non-magnetic material, there can be enumerated Cr, Al, Cu and stainless steel, for example.

Still moreover, the sputtering apparatus, which is constructed such that the aforementioned electrode surface plate has its center portion made of a material having a high heat conductivity such as Al and its peripheral portion made of a soft magnetic material, can maintain the substrate temperature during the sputtering operation at a lower temperature of about 70° C. than the conventional temperature of 320° to 350° C., if the substrate is placed on the above-specified center portion.

The sputtering apparatus of the present invention may have its construction modified such that the cathode 12 and the substrate electrode 13 are coaxially placed to face each other although the cathode 12 and the substrate electrode 13 are usually juxtaposed to face each other, as shown in FIG. 1a.

If a predetermined material is deposited upon the substrate to form the thin film by the use of the sputtering apparatus having the construction thus far described according to the prior art, the uniformity of the deposition rate distribution is remarkably improved so that the obtained thickness of the thin film on the substrate and the uniformity thereof are excellent.

DESCRIPTION OF THE PREFERRED EMBODIMENTS

The present invention will be described in more detail in the following in conjunction with the embodiments and examples thereof.

Embodiment 1

Figure 1A:
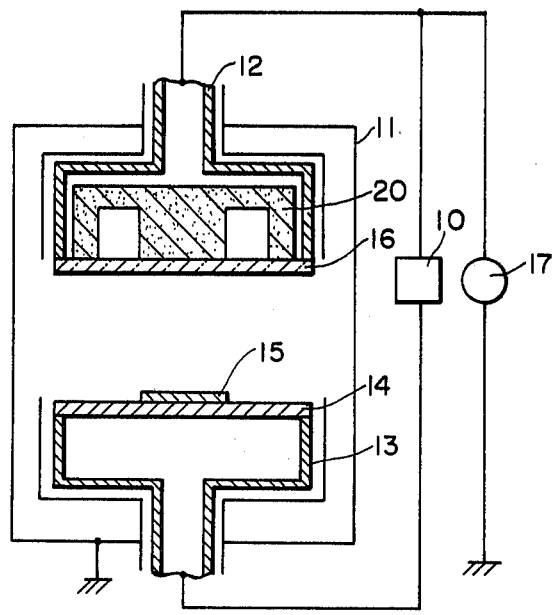
FIG. 1a is a schematic section illustrating the sputtering apparatus having the cathode of the planar magnetron high rate type.

The sputtering apparatus having the construction shown in FIG. 1a and having its electrode surface plate 14 made of pure iron (its initial permeability: 200 to 300) containing 0.5 wt. % of impurity at the highest was used. The permanent magnet 20 is constructed such that either an N or S pole is disposed at the center and is surrounded at a spacing of 3 to 6 cm by the opposite pole. The shape of that section of the center magnetic pole, which is arranged in parallel with the target surface, is either such a circle as usually has a diameter of 10 to 15 cm or such an oval or a rectangular as has its shorter outer size such as usually has a shorter diameter or side of 10 to 15 cm. In the present embodiment, the target is made to have such a circular shape that the N pole is surrounded at a spacing of 3.5 cm by the S pole has a diameter of 4 cm. The width of the annular S pole is 1 cm, and the diameter of the target is 15 cm. The material of the target 16 is $SiO_2$, and the substrate electrode 13 is made of Cu whereas the substrate 15 is made of Si. The electrode surface plate 14 is usually made to have a size substantially equal to or smaller than the target 16. In the present embodiment, both the two are made to have the same size having a diameter of 15 cm. The distance between the cathode 12 and the substrate electrode 13, i.e., the spacing between the target 16 and the electrode surface plate 14 is usually 3 to 6 cm and is 4.5 cm in the present embodiment. The other constructions and conditions are the same as those having been described hereinbefore.

The substrate 15 is placed on the electrode surface plate 14 of the sputtering apparatus thus far described. After the chamber 11 has been evacuated, Ar under 0.8 Pa is introduced. The sputtering operations are effected by impressing high-frequency electric powers of 2.5 $W/cm^2$ and 0.2 $W/cm^2$ to the cathode 12 and the substrate electrode 13, respectively.

Figure 1B:
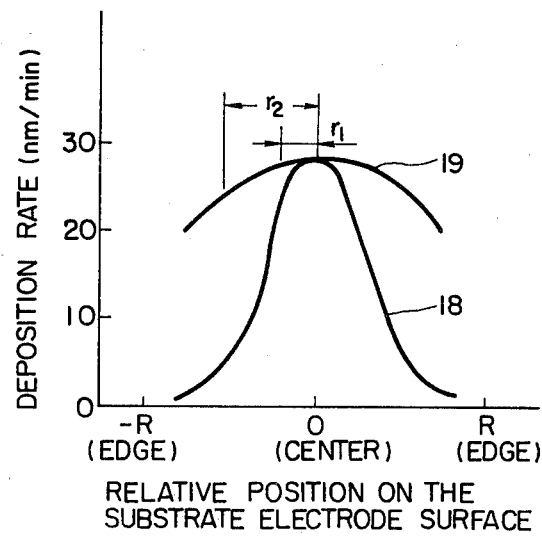
FIG. 1b is a graphical presentation illustrating the deposition rate distributions of the prior art and one embodiment of the present invention.

The measured results of the deposition rate distribution of the $SiO_2$ upon the electrode surface plate in case the sputtering operation is performed under the above-specified conditions are plotted as a curve 19 in FIG. 1b. The ratio $r_2/R$ of the radius $r_2$ of the region (i.e., the uniform region), in which the thickness distribution of the $SiO_2$ film deposited is within a range of $\pm 10\%$, to the radius R of the electrode surface plate 14 is about 0.5. As a result, the uniform region in the electrode surface plate 14 is increased about 7.7 times as high as the conventional value if the sputtering apparatus of the present embodiment is used. Not only in FIG. 1b but also in FIG. 2b appearing hereinafter, the abscissa indicates a position, which is located between the center (which is indicated at 0 in the drawings) of the electrode surface plate of the substrate electrode to an edge (which is indicated at R in the drawings), in terms of a distance (in a relative value) from that center. The letter R indicates the radius of the electrode surface plate 14. On the other hand, the ordinate indicates the deposition rate (nm/mm) of the $SiO_2$.

Furthermore, the pure iron used as the electrode surface plate 14 is conveniently prepared as usual by machining a steel plate having a thickness of 1 to several 10 mm and is made to have a thickness of 10 mm in the present embodiment. Incidentally, it is sufficient, as has been described hereinbefore, that the thickness of the soft magnetic material is equal to or larger than 1 $\mu$m. In case a remarkably thin soft magnetic material is used, it is sufficient to form a film of a predetermined soft magnetic material on the non-magnetic material such as Al by the vacuum evaporation method thereby to prepare the electrode surface plate. In this case, it has been difficult to form a continuous film for a thickness not exceeding 1 $\mu$m.

It is also sufficient to place the same material as that of the target upon the electrode surface plate 14 made of the soft magnetic material and to place thereon the substrate 15. In this case, since the soft magnetic material is not exposed to the plasma, the sample is not contaminated while the uniformity of the film forming rate being less deteriorated.

Reference 1

The SiO$_2$ was deposited upon the substrate similarly to the Embodiment 1 excepting the fact that the electrode surface plate 14 was made of Al. The measured results of the deposition rate distribution of the SiO$_2$ on the electrode surface plate 14 are plotted as the curve in FIG. 1b. The ratio $r_1/R$ of the radius $r_1$ of the uniform region to the radius R of the electrode surface 14 takes a value of about 0.18, as has been described hereinbefore, so that the uniform region is far narrower than that of the case of the foregoing embodiment, as will be understood.

Embodiment 2

Figure 2A:
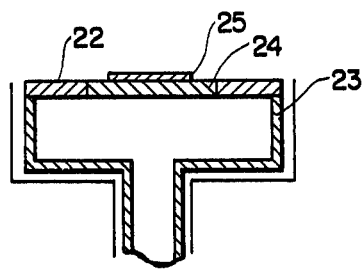
FIG. 2a is a sectional view showing the construction in the vicinity of the substrate electrode of the sputtering apparatus according to another embodiment of the present invention.

FIG. 2a is a sectional view showing the construction in the vicinity of the substrate electrode of the sputtering apparatus used in the present embodiment. Numeral 22 indicates the peripheral portion of the electrode surface plate, which is made of pure iron (its heat conductivity; about 0.5 to 0.8 J/cm.s.K) similar to that of the Embodiment 1. Numeral 24 indicates the center portion (its diameter: 15 cm) of the electrode surface plate and is made of Al (its heat conductivity: about 2.3 J/cm.s.K) having a high heat conductivity. Numeral 23 indicates the substrate electrode. A substrate 25 was made of Si and was placed upon the center portion 24 thereby to improve the thermal contact between the substrate 25 and the substrate electrode 23. The SiO$_2$ was deposited upon the substrate similarly to the Embodiment 1 excepting the aforementioned items.

In the present embodiment, the substrate temperature in the deposition of the SiO$_2$ film was 250° to 280° C. so that it could be maintained about 70° C. lower than that of the Embodiment 1.

Figure 2B:
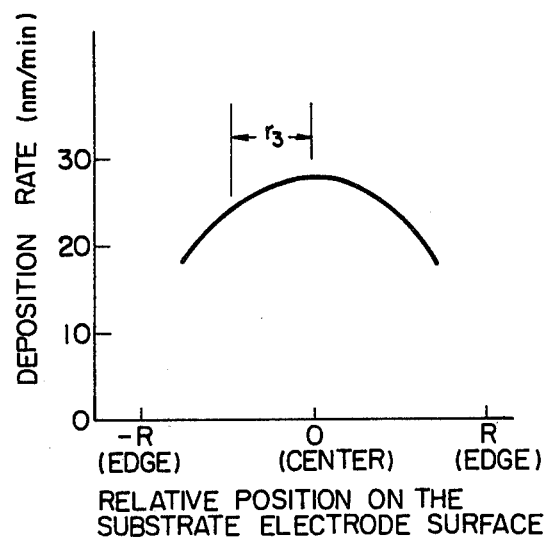
FIG. 2b is a graphical presentation illustrating the deposition rate distributions of the second embodiment of the present invention.

On the other hand, the measured results of the deposition rate distribution of the SiO$_2$ on the electrode surface plate of the substrate electrode are plotted in FIG. 2b. The ratio $r_3/R$ of the radius $r_3$ of the uniform region to the radius R of the electrode surface plate takes a value of about 0.47, and the deposition rate distribution is accepted as sufficiently practical, although its distribution is more or less deteriorated than that of the Embodiment 1, so that it is substantially satisfactory. As a result, the SiO$_2$ film having an excellent thickness distribution could be deposited at a relatively low substrate temperature according to the present embodiment. By depositing the SiO$_2$ film in the manner according to the present embodiment, the substrate 25 becomes reluctant to be damaged during the formation of the SiO$_2$ film.

As has been described hereinbefore, the uniformity in the thickness distribution of the film deposited is markedly improved by the use of the sputtering method of the present invention.

Moreover, the sputtering apparatus of the present invention can also be applied to the forming processes of many kinds of metal films of Al, Ti, Cr and so on in addition to the insulation film of silicon nitride, Al$_2$O$_3$ and so on.

Although all the embodiments thus far described are directed to the case in which pure iron was used as the soft magnetic materials, it has been found that the uniformity of the deposition rate distribution is better improved in case the permalloy, super-permalloy, mumetal and so on are used. Nevertheless, these magnetic materials are far more expensive than the pure iron.

Obviously, many modifications and variations of the present invention are possible in the light of the above teachings. It is, therefore, to be understood that within the scope of the appended claims the invention may be practised otherwise than as specifically described.

What is claimed is:

1. A sputtering apparatus comprising at least one cathode and at least one substrate electrode facing the cathode and having an electrode surface plate, the improvement wherein the electrode surface plate of said at least one substrate electrode facing said cathode has at least a portion thereof that is made of a soft magnetic material having an initial permeability of at least 100.

2. A sputtering apparatus as set forth in claim 1, wherein said cathode is the planar magnetron high rate type cathode.

3. A sputtering apparatus as set forth in claim 2, wherein at least 20% of the area of said electrode surface plate is made of said soft magnetic material.

4. A sputtering apparatus as set forth in claim 2, wherein the entire area of said electrode surface plate is made of said soft magnetic material.

5. A sputtering apparatus as set forth in claim 2, wherein said at least a portion of said electrode surface plate that is made of said soft magnetic material has a surface covered with a non-magnetic material.

6. A sputtering apparatus as set forth in claim 2, wherein said at least a portion of said electrode surface place that is made of a soft magnetic material covers a portion of said electrode surface plate that is made of non-magnetic material.

7. A sputtering apparatus as set forth in claim 2, wherein said electrode surface plate has its center portion made of a non-magnetic material having a high heat conductivity and its peripheral portion made of said soft magnetic material.

8. A sputtering apparatus as set forth in claim 1, wherein said substrate electrode is connected through a power divider with a high-frequency power source.

9. A sputtering apparatus as set forth in claim 1, wherein said at least a portion of said electrode surface plate that is made of said soft magnetic material has a thickness of at least 1 μm.

10. A sputtering apparatus as set forth in claim 1, wherein said soft magnetic material is comprised of iron or an iron alloy.

11. A sputtering apparatus as set forth in claim 1, wherein the entire electrode surface plate is made from the soft magnetic material having an initial permeability of at least 100.

* * * * *